United States Patent [19]

Andre

[11] 3,990,392
[45] Nov. 9, 1976

[54] EPITAXIAL GROWTH APPARATUS

[75] Inventor: Elie Andre, Herouville-St. Clair, France

[73] Assignee: U.S. Philips Corporation, New York, N.Y.

[22] Filed: Dec. 24, 1975

[21] Appl. No.: 644,064

Related U.S. Application Data

[63] Continuation of Ser. No. 369,571, June 13, 1973, abandoned, which is a continuation of Ser. No. 889,026, Dec. 30, 1969, abandoned.

[30] Foreign Application Priority Data

Dec. 31, 1968  France .......................... 68.182980

[52] U.S. Cl. ................................ 118/404; 156/622
[51] Int. Cl.² .......................................... B05C 3/09
[58] Field of Search ........... 118/404, 405, 413, 415; 148/171, 172; 156/622

[56] References Cited

UNITED STATES PATENTS

| 2,329,378 | 9/1943 | Kuehner | 118/413 |
| 3,551,219 | 12/1970 | Parish et al. | 156/622 |

Primary Examiner—Morris Kaplan
Attorney, Agent, or Firm—Frank R. Trifari; Ronald L. Drumheller

[57] ABSTRACT

Method of and device for the epitaxial deposition of a layer of a semiconductor material on a substantially flat side of a crystalline substrate from a melt which contains the semiconductor material in which a crucible is used having a slide and the contact between the melt and the substrate is effected by moving said slide. The slide may form a separation between a space in which the melt is formed and a space in which the substrate is situated. The slide may also comprise a recess for the substrate.

4 Claims, 4 Drawing Figures

EPITAXIAL GROWTH APPARATUS

This is a continuation of Ser. No. 369,571, filed June 13, 1973, now abandoned, which was a continuation of Ser. No. 889,026, filed Dec. 30, 1969, now abandoned.

The invention relates to an apparatus of epitaxially providing a layer of a semiconductor material, in particular of a type $A^{III}B^{V}$, from a melt containing the semiconductor material, in particular a solution of a compound of the type $A^{III}B^{V}$ in a melt of the $A^{III}$ element, on a substantially flat side of a single crystal substrate, in particular for manufacturing semiconductor devices including integrated circuits, in which during the formation of the melt in a crucible the material of the melt is kept out of contact with the substrate, the melt and the substrate being then contacted with another by a mechanical movement and the epitaxial layer being deposited by cooling. The invention furthermore relates to a device for carrying out said method and to a single crystal substrate comprising an epitaxial layer of a semiconductor material, in particular in the form of a semiconductor device, manufactured by using said method.

Layers of semiconductor material provided epitaxially on a single crystal substrate are used in semiconductor technology for manufacturing semiconductor devices, namely both discrete semiconductor devices and integrated circuits. The substrate itself may consist of a semiconductor material, for example, of the same basic material as the epitaxial layer. Particularly in the latter case the crystal lattice of the substrate may extend into the epitaxial layer. In general, the crystal lattice of the epitaxial layer is oriented specifically on the crystal lattice of the substrate. The substrate may also consist of a single crystalline insulating material, for example, single crystalline aluminium oxide, particularly for manufacturing semiconductor devices of the thin-film type or of the so-called flatland type and for integrated circuits having islands of semiconductor material insulated from one another.

In addition to the method of epitaxially depositing the semiconductor material from the gaseous phase, for example, from gaseous compounds b pyrolyses, in which reaction with other gases, for example, hydrogen may be involved, it is known to deposit an epitaxial layer on a flat side of a substrate from a melt which contains the semiconductor material. In general lower temperatures are required than in the epitaxial deposition from the gaseous phase. Particularly in the case of semiconductor materials which consist of compounds having a volatile component, for example, semiconductor materials of the type $A^{III}B^{V}$, this low temperature is of advantage while the use of a molten solvent for the semiconductor further reduces the vapour pressure of the volatile compound. This is the case in particular when, for example, in the case of a compound of the type $A^{III}B^{V}$, the $A^{III}$ element is used as a solvent for the $A^{III}B^{V}$ compound. It is known, for example, to deposit by means of this so-called liquid epitaxy a surface layer of gallium arsenide of high purity and high electron mobility from a solution of gallium arsenide in gallium. For carrying out this process a box-shaped crucible is used in which the substrate was secured on the bottom of the crucible near one side-wall and the material for forming the melt was provided near the opposite side-wall. The crucible was placed in a tubular chamber in which a protective gas atmosphere could be provided. This chamber was placed in an oven by means of which the crucible could be heated. The oven with the tubular chamber and the crucible was given such an inclined position that the part of the bottom of the crucible where the substrate was secured was positioned above the part of the bottom where the material to be melted was situated. This inclined position was such that, upon melting the gallium, the substrate remained out of contact with the formed melt. When a homogeneous melt had formed consisting of a substantially saturated solution of gallium arsenide in gallium, the oven with its contents was tilted in such manner that the melt flown on the substrate after which, by gradual cooling, the epitaxial gallium arsenide layer was deposited on the substrate. A drawback of this known method is that, for tilting, a comparatively heavy construction of the device and comparatively large forces for carrying out the tilting movement are required.

The present invention is based on the idea of using a moving component in the crucible to separate the various materials from one another or to contact them with one another at the correct instant and, if desirable, maintaining the contact for only another instant only. According to the invention, a method of the type mentioned in the preamble is characterized in that a crucible is used having a slide in which the contact between the melt and the substrate is effected by moving the slide. No heavy mechanical means are necessary for the movement of such a slide. The movement may be carried out with a simple rectilinear movement which can easily be effected with means which are passed through the wall of a chamber if provided. When a tubular chamber and a tubular furnace are used, said means may be passed through one end of the tubular chamber.

It is to be noted that it is known for providing alloy contacts on semiconductors to use alloying jigs which comprise moving components. It is known, for example, to melt the contact material to be alloyed at a location in the jig which is separated from the semiconductor body and then causing the molten drops to fall on the semiconductor surface by opening a cock which is provided with a lever. It is furthermore known to use a filling device for filling alloying jigs having a large number of channels for introducinng pellets to be alloyed, which device consists of a disc having apertures and having a thickness which is so small that each aperture can comprise only one pellet. For filling the alloying jig, the filling device is arranged so that the apertures in the filling device are not situated over the channels of the jig, after which said apertures are filled each with one pellet only and the filling device is then displaced relative to the jig in such manner that the apertures become located over the channels and the pellets drop into the channels. It is achieved in this manner that the alloying jig is filled with not more than one pellet per channel. The jigs thus filled are separated from the filling device and then placed in an oven for carrying out the alloying process. Apart from the fact that the jig in the latter case comprises no moving components which are used during the heating process and the fact that in the first case a rotatable cock is used, instead of a slide other purpose are aimed at in the alloying process than in providing an epitaxial layer of a semiconductor material on a substantially flat side of a substrate. The object of the alloying process is the manufacture of a local rectifying or ohmic electrode, provided with a contact metal, in which an alloy with the semiconductor material of the body is formed, the alloy penetrating into the semiconductor material. Although upon cooling the semiconductor material dissolved segregates, namely according to the crystal lattice of the substrate, a prescribed thickness of this deposit is not aimed at and it can serve as a part of a single electrode only. For such a local electrode, generally a quantity of material to be alloyed is used which is small relative to the mass of the semiconductor body used. However, in the technology of providing an epitaxial layer on a flat side of a semiconductor the object is to provide a layer of a comparatively small thickness over a comparatively large surface area, the rest of the melt which remains after the formation of the epitaxial layer having to be removed. It is desirable to not only obtain a layer of a comparatively uniform thickness but also a good flat junction with the substrate. For that purpose the extent of dissolving of the substrate material should generally be kept low, for example, sufficient to give a slight etching of the substrate surface. For that purpose the composition of the melt and the temperature used during contacting are chosen to be such that the melt is a substantially saturated solution of the semiconductor material to be deposited. In order to obtain a uniform thickness and to promote a composition in the direction of the thickness which is homogeneous as regards impurities, it is desirable that during this deposition to the desired thickness the decrease in temperature and the variation in compositon of the melt should not be too large. For that purpose a quantity of material to be melted will generally be used which is large relative to the volume of the layer to be deposited. Therefore, the quantity of melt used may even be large relative to the volume of the substrate on which the epitaxial layer is to be deposited.

In the known method of liquid epitaxy the melt is removed from the substrate surface by retilting when upon cooling a suitable thickness has been reached. However, melt may remain on the surface which, due to its surface tension, will obtain a spherically shaped surface or may even contract in the form of a few separate drops. This again may result in a further uneven deposition of semiconductor material in which the regaining of a uniform thickness is hard to realize. However, such a uniform thickness is desirable for the subsequent manufacture of semiconductor devices in the epitaxial layer. In this respect, a known jig for alloying contacts to semiconductors, for example, in which a cock is used to contact the drops of contact materials with the semiconductor surface at the required temperature, would give no improvement either. This is possible indeed with the use of a slide according to the invention. For this purpose, according to a preferred embodiment the slide may be returned to its initial position after the deposition of the epitaxial layer, the substrate with the formed epitaxial layer being separated from at least the greater part of the molten material.

The invention provides the great advantage of the simplicity of the means with which the method according to the invention may be carried into effect. Since the movable part of the crucible, the slide, is of low weight and small dimensions, the operation is not difficult and may be alternated, if desirable. In particular a rectilinear movement in the direction of the axis of a possibly used tubular chamber and oven facilitates the operation from without while both the substrate and the material to be melted can be placed axially in the tubular oven.

According to a preferred embodiment the crucible comprises a space for the melt and a space for the substrate, which spaces are separated from each other during heating in a first position of the slide after which, upon displacing the slide, said space are made to communicate with one another and the melt is contacted with the substrate. The slide may have the form of a thin plate having lateral dimensions adapted to those of the interior of the crucible, which plate is passed through a slit in the wall of the crucible.

In another preferred embodiment the slide comprises a recess for placing the substrate in which during heating the slide assumes a position relative to the space comprising the molten material in which the substrate is out of contact with the melt, after which, upon moving the slide, contact between the melt and the substrate is effected. In this embodiment it is even possible to use in the crucible two spaces for different melt compositions in which said two spaces are separated from each other by a partition, said partition comprising a slit for passing the slide. The location of the substrate in a recess of the slide furthermore has the advantage that the substrate may be kept not only outside the crucible but even outside the furnace, which may be of importance, for example, when the substrate itself consists of a compound having a volatile component, for example, a compound of the type $A^{III} B^{V}$. Since the slide is operated with simple movements it is possible to operate the movements of said slide automatically, in particular by programming, including control of the temperature of the oven used.

The invention also comprises an oven for heating the material for the melt, a chamber, in which a crucible is situated which comprises a movable slide, which slide can assume at least two positions in which, in one position, the space in which the material is melted, is separated from the space of the substrate and in the other position said spaces communicate with each other, an operating member being present by means of which the position of the slide in the chamber can be varied. According to a preferred embodiment of said device the space for the substrate is formed by a recess in the slide.

The invention also comprises a single crystal substrate provided with an epitaxial layer of a semiconductor material, in particular in the form of a semiconductor device, manufactured by using the method according to the invention.

In order that the invention may be readily carried into effect, it will now be described in greater detail, by way of example, with reference to the accompanying drawings, in which FIGS. 1 and 2 show a crucible with a slide to be used in an embodiment of the method according to the invention, in two stages of that embodiment.

Figure 1:
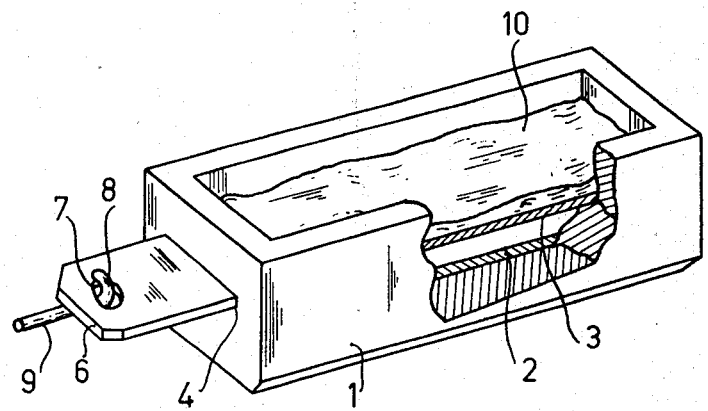
Figure 2:
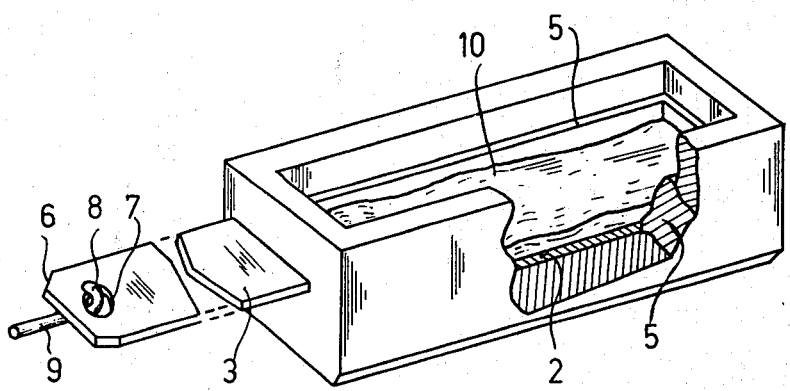

The crucible shown in FIGS. 1 and 2 is constructed in form of a rectangular parallelpiped. This crucible 1 comprises a suitable refractory material which can withstand considerable temperature variations or temperatures increases without any change structure, for example, of boron nitride or of quartz. A single crystal substrate 2 is provided on the bottom and is destined to be covered on one side by an epitaxial layer. A slide 3 of the same refractory material is movable through a slot 4 having a corresponding cross section and can slide in the interior of the crucible over at least two ridges 5. The slide 3 is situated less than one millimeter above the substrate 2. At the end 6 of the movable slide 3 means are present to move the slide. In the present case an eyelet is present in which a hook 8 may be provided which is situated at the end of a rod 9. When using a tubular chamber (not shown) said rod may be passed through one end of the tube by means of which the slide can be operated from without.

In the stage of the method shown in FIG. 1 the movable slide 3 is inserted into the crucible 1 and serves as a support for the melt 10, for example, consisting of a solutin of gallium arsenide in gallium. The material of the melt can be formed previously by saturating molten gallium at 900° C with arsenic or gallium arsenide and then solidifying by cooling. The slide 1 is heated to the desirable temperature, the contact between the substrate and melt being then effected. In the case of a solution of arsenic (gallium arsenide) in gallium saturated at 900° C, a temperature of 900° C or a few degrees higher temperature is chosen. When said temperature is reached the slide is withdrawn over such a distance that the solution 10 falls on the substrate 2 (see FIG. 2). Then the solution 10 is allowed to cool so that the epitaxial layer can deposit.

It is possible to cause the whole solution to crystallize out, in which an epitaxial layer of a large thickness is obtained, for example, of approximately 100 microns. In general and in particular when smaller thicknesses of the epitaxial layer are aimed at, it is desirable, after a certain cooling, to remove the remainder of the melt, fully or at least for the greater part, from the substrate surface. In the device shown in FIGS. 1 and 2 the slide may be introduced from the position shown in FIG. 2 into the crucible again in the position shown in FIG. 1 when the given lower temperature is reached; in the case of the above-mentioned gallium arsenide solution, for example, at a temperature of 500° C. The greater part of the melt may thus become located again above the slide 3. In order to facilitate the stowing up of the melt 10, the end part of the slide 3, sliding in the crucible, may be bevelled at its upperside so that said end is wedge-shaped. In general melts of a metallic character are used which in general have a high surface tension. As a result of this the pushing away of the melt from the substrate surface to the upperside of the slide is promoted.

For clearness' sake the distance, and consequently the space between the slide and the surface of the substrate, are designed in FIGS. 1 and 2 on a larger scale so that the volume of said space seems to be larger then the volume of the melt. In practice, for example, with the above-stated dimensions of the distance between the slide and the substrate, the melt volume is large with respect to that of the said intermediate space.

Figure 3:
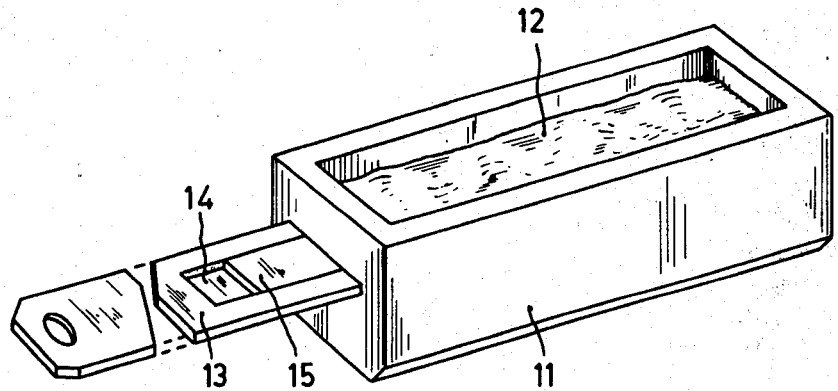
FIG. 3 shows a second example of a crucible with slide to be used in another embodiment of the method according to the invention.

In the device shown in FIG. 3 the crucible 11 has a shape corresponding to that shown in FIGS. 1 and 2. The crucible 11 comprises the material for the melt 12 and in first instance the movable slide 13 is used in the withdrawn position so that upon heating for the formation of the melt the formed melt will engage the bottom of the crucible 11. The movable slide 13 comprises a recess 14 destined for receiving the substrate 15. During the heating-up period the slide 13 is in the withdrawn position in such manner that the substrate 15 is situated outside the crucible 11. The melt 12 formed during heating, for example, consisting of a solution of gallium arsenide in gallium, bears on the bottom of the crucible while the meniscus of the melt is projected above the slide 13. When the melt has reached the required temperature the slide is introduced over such a distance that the substrate 15 in the recess 14 becomes located in the melt, after which cooling is carried out. In this case also the epitaxial deposition can be restricted, namely by withdrawing the slide with the substrate at a desirable lower temperature.

Figure 4:
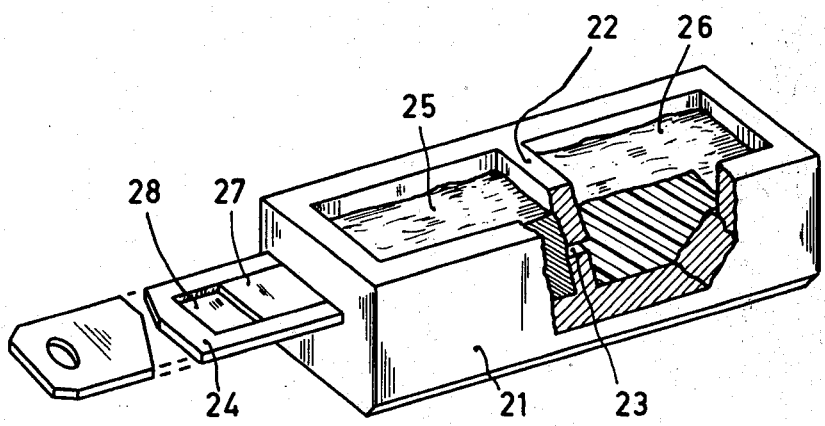
FIG. 4 shows another variation of a crucible with a slide for again another embodiment of the method according to the invention.

FIG. 4 shows a third embodiment of a crucible for forming an epitaxial deposition from a melt on a substrate. The crucible 21 again has the shape as the crucible in the preceding Figures but in this case the crucible comprises a vertical partition 22 which divides the melting crucible in two spaces. Said partition 22 comprises a slit 23 through which the movable slide 24 can be introduced. The two spaces in the crucible on either side of the partition 22 are filled with solutions 25 and 26 doped differently. Due to their high surface tension the two liquids cannot pass through the slit 23, not even when the slide 24 is withdrawn from the crucible 21 over such a distance that it is situated outside the slit 23. The slide 24 comprises a recess 28 for receiving the substrate 27. In the heating-up period the slide 24 is withdrawn over such a distance that the substrate 27 is situated outside the crucible. Upon reaching a given temperature the slide can be introduced over such a distance that the substrate 27 is contacted with the melt 25. After the formation of an epitaxial layer of a given conductivity type during the first cooling, the slide 24 can be introduced further in such manner that the substrate 27 passes into the melt 26 through the slit 23 from which an epitaxial layer of the opposite conductivity type can be deposited in a following cooling period. By repeated displacement of the slide 22 layers of different conductivity types can successively be deposited on the substrate 27 after which, upon reaching a given temperature, the slide 24 can be withdrawn over such a distance that the substrate 27 becomes located outside the crucible 21 and the assembly is cooled. It is obvious that the compositions of the melt 25 and the melt 26, in particular as regards the additions of donors and/or acceptors or even as regards the solvent and the semiconductor dissolved therein, can be chosen differently in another manner. For example, it is in principle possible to deposit layers of the same conductivity type but of different conductivity, for example, by using the same impurity in different concentrations in the melts 25 and 26.

It will be obvious that the invention is not restricted to the embodiments described here by way of example but that many variations are possible to those skilled in the art without departing from the scope of this invention.

I claim:

1. Apparatus for epitaxially depositing a layer of semiconductor material onto a substrate, comprising:
   a crucible for holding a melt of semiconductor material, said crucible having an opening through a wall thereof at a position below the intended level of the melt; and
   a slide adapted to continuously block said opening so that melt cannot flow through said opening, said slide having a recess for containing a substrate, said slide being movable between a first position where said recess and contained substrate are out of contact with the melt in said crucible and a second position where a major surface of the substrate is in contact with the melt in said crucible for epitaxially depositing a layer of semiconductor material onto said surface.

2. Apparatus as defined in claim 1 wherein the slide holds the substrate in a position such that movement of said slide from said second to said first position causes an edge of said opening to pass sufficiently close to said major surface of said substrate to wipe substantially all melt therefrom.

3. Apparatus as defined in claim 2 wherein said opening is a slit and said slide is adapted to fit within said slit for movement into and out of said crucible.

4. Apparatus as defined in claim 3 wherein said slit is of rectangular shape and said slide is of corresponding generally rectangular solid shape with a recess in the top major surface thereof adapted to the dimensions of a substrate such that the substrate fits within said recess with a major surface of said substrate substantially coplanar with said top major surface of said slide.

* * * * *